United States Patent [19]

Duret

[11] Patent Number: 5,463,318

[45] Date of Patent: Oct. 31, 1995

[54] DIFFERENTIAL RESONANCE MAGNETOMETER

[75] Inventor: Denis Duret, Grenoble, France

[73] Assignee: Commissariat a l'Energie Atomique, Paris, France

[21] Appl. No.: 202,237

[22] Filed: Feb. 25, 1994

[30] Foreign Application Priority Data

Mar. 5, 1993 [FR] France .................................. 93 02591

[51] Int. Cl.⁶ .............................. G01V 3/00; G01V 3/08; G01V 3/14
[52] U.S. Cl. ........................... 324/301; 324/300; 324/303
[58] Field of Search ..................................... 324/300, 301, 324/302, 303, 304

[56]     References Cited

U.S. PATENT DOCUMENTS 2,856,579  10/1958  Packard .
2,975,360  3/1961  Bell .
4,114,087  9/1978  Fry .
4,260,949  4/1981  Dalton, Jr. .
5,187,438  2/1993  Alcouffe et al. .
5,221,897  6/1993  Duret et al. .
5,296,802  3/1984  Beranger et al. .

FOREIGN PATENT DOCUMENTS 0463919  1/1992  European Pat. Off. .
2583885  12/1986  France .

*Primary Examiner*—Sandra L. O'Shea
*Assistant Examiner*—Mack Haynes
*Attorney, Agent, or Firm*—Oblon, Spivak, McClelland, Maier, & Neustadt

[57]     ABSTRACT

A differential resonance magnetometer, which includes a reference assembly and at least one measurement assembly. A polarization current is produced by the reference assembly is the same as a polarization current used in the measurement assembly. A feedback signal produced by the measurement assembly directly gives a difference between fields in the reference and measurement assemblies. Such a device may find particular application to magnetometry.

10 Claims, 5 Drawing Sheets

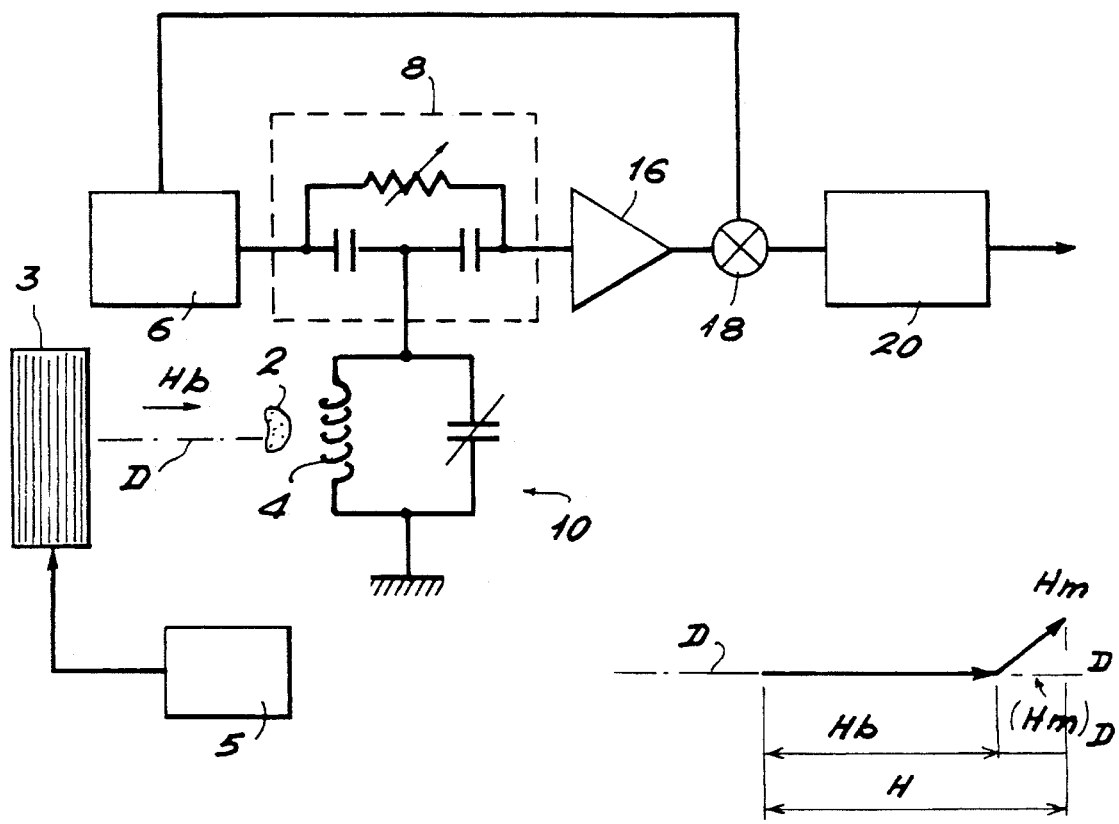
FIG. 1
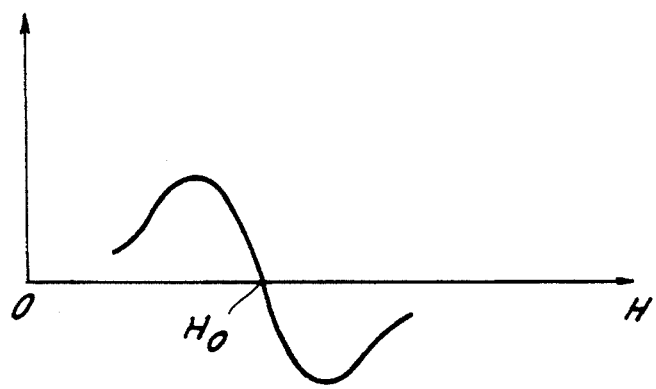
FIG. 2
FIG. 3

DIFFERENTIAL RESONANCE MAGNETOMETER

BACKGROUND OF THE INVENTION

1. Field of the Invention

The present invention relates to a differential resonance magnetometer. It is used in the relative measurement of weak magnetic fields, e.g. of a few dozen microteslas, i.e. in the measurement of the space and/or time variations of such fields.

The invention has applications in geophysics, mining prospecting, space detection, medicine, etc.

2. Discussion of the Background

The magnetometer according to the invention is of the directional resonance type. These apparatuses are well known and are e.g. described in French patent application FR-A-2 663 751 filed by the present applicant (said application containing bibliographical references on the subject) or in the corresponding European patent application EP-A-463 919, or in the article by D. DURET, M. MOUSSAVI and M. BERANGER entitled "Use of High Performance Electron Spin Resonance Materials for the Design of Scalar and Vectorial Magnetometers", published in IEEE Transactions on Magnetics, vol.27, no. 6, Nov. 1991, pp.5405–5407.

The structure and operation of these apparatuses will briefly be described in certain of their variants with reference to the attached FIGS. 1 to 6.

Firstly, in FIG. 1, it is possible to see a sample 2 containing a material having electron or nuclear spins, a first winding 3 producing a magnetic polarization field Hb directed in direction D, a second winding 4 in the vicinity of the sample 2, a current generator 5 having a regulatable intensity supplying the first winding 3, a high frequency generator 6 connected to a measuring bridge 8, which is in turn connected to a resonant circuit 10 containing the winding 4, a low noise amplifier 16 connected to the measuring bridge 8, a balance mixer 18 receiving on the one hand the voltage supplied by the amplifier 16 and on the other a reference voltage from the high frequency generator 6 and finally a low pass filter 20.

The sample 2 is subject to the field to be measured Hm, as well as to the polarization field Hb. These two fields are not generally colinear. The magnetic field measured by such an apparatus is the sum of Hb and the component of Hm projected in the direction D and which is designated $(Hm)_D$, bearing in mind that Hb is much greater than Hm. These different fields or components are shown in FIG. 2. The total field in the direction D is designated H.

The apparatus functions as follows. The generator 6, connected to the circuit 10 and to its winding 4, is able to excite the resonance of the spins of the sample 2. Its frequency is very accurately fixed ($10^{-9}$ to $10^{-6}$). The resonance of the spins occurs when the frequency of of the excitation signal is equal to the LARMOR frequency, conventionally determined by the relation $(1/(2\pi))\gamma Ho$, in which $\gamma$ is the gyromagnetic ratio of the sample used (in the case of the electron $\gamma=2\pi\bullet 28$ GHz/T) and Ho is the value at resonance of the total magnetic field applied.

At the same time the circuit 10 and its winding 4 are able to detect this resonance, the function of the circuit 8 being to separate the excitation and the detection.

The apparatus shown in FIG. 1 detects the passage through the resonance when, the frequency of being fixed, the total field H passes through the value Ho. Thus, FIG. 3 shows the variations of the voltage V1 supplied by the low pass filter 20 when the field H varies and passes through Ho. This curve is of the dispersion type, i.e. antisymmetrical, with a positive part, a cancelling out (for the value Ho corresponding to resonance) and a negative part. The knowledge of Ho makes it possible to rise to $(Hm)_D$ if Hb is known.

The apparatus of FIG. 4 is a variant where use is also made of an oscillator 22 and a winding 24 for producing a magnetic field having an audio frequency fm, said field, known as the dither field being superimposed on the polarization field Hb.

Moreover, in the variant of FIG. 4 and at the output of the balanced mixer 18, the low pass filter 20 of FIG. 1 is replaced by a band pass filter 26 centered around the frequency fm. A phase shifter 28 receives the high frequency signal from the generator 6 and supplies a signal of appropriate phase to the balanced mixer 18.

A circuit 30 for synchronous detection at the frequency fm receives on one of its inputs a reference signal from the generator 22. This reference signal has a frequency fm, but its amplitude and phase can be made different from those of the signal supplied by the oscillator 22 to the coil 24. The circuit 30 has another input connected to the output of the filter 26 and finally supplies a voltage Vs.

By fitting at the output of the synchronous detection means 30 an appropriate, not shown, observation means, it is possible to observe the curve of the variations of Vs as a function of the total field H. This curve is shown in FIG. 5. Like that of FIG. 3, it is an antisymmetrical curve with a cancelling out for the value Ho of the field corresponding to the resonance of the spins.

With such apparatuses, a variation of the field to be measured Hm, if it is well below the width of the lines shown in FIGS. 3 and 5, leads to a variation compared with the resonance value and by the appearance of a non-zero voltage (V1 or Vs) at the magnetometer output. This voltage varies substantially linearly as a function of the variation at Ho.

The linearity can be improved by a field feedback obtained by using the voltage V1 (FIG. 3) or the voltage Vs (FIG. 5) as the error signal, by integrating said voltage and by injecting into a feedback coil a current proportional to the integrated voltage. The axis of this feedback coil must be parallel to the direction D of the polarization field.

This can be seen in the diagram of FIG. 6 where, in addition to the means already shown in FIG. 4, there are an integrator 31 and a feedback winding 32. In such an apparatus, the total field is still maintained at the value corresponding to resonance and the integrated error signal constitutes the measurement signal, which appears on the apparatus output 34.

In other words, no matter what the field applied from the outside to the sample, along the direction D the said sample sees the same field, namely that ensuring the resonance of the spins. As the field corresponding to resonance is much larger (more than ten times) than the field having an external origin to be measured, the geometric sum modulus (cf. FIG. 2) is substantially equal to the sum of the field created by the polarization current and directed in accordance with direction D and the projection on said direction of the external field to be measured. In other words, the means 31 and 32 make the apparatus dependent on the resonance, no matter what the field applied from the outside.

In the embodiment illustrated in FIG. 6, it should be also noted that there are three windings, respectively polarization 3, dither 24 and feedback 32, which are assumed to be separate. However, as they all have the same axis, they can be combined into one and the same winding.

The integrator 31 can either directly supply the feedback current, or can supply a voltage, in which case it is necessary to associate a voltage - current converter with it, e.g. in the form of a resistor.

Thus, according to this prior art, known directional resonance magnetometers generally have a sample with spins subject to the field to be measured, means for applying to said sample a magnetic polarization field, means for applying to the sample a radio-frequency field and for exciting the resonance of the spins, means for detecting said resonance, means for producing an anti-symmetrical electrical signal which is cancelled out when the total field applied to the sample assumes the value Ho corresponding to the resonance of the spins and which is positive or negative as a function of whether the total field applied is higher or lower than said particular value (Ho). In the absence of a field to be measured, the apparatus is regulated so that it is at resonance. In the presence of a field to be measured, the feedback field reestablishes the resonance and the value of the integrated error signal (or the feedback current) constitutes the measurement of the magnetic field.

In order to produce a differential magnetometer with the means described hereinbefore, it is necessary to have two such apparatuses at two separate points and form the difference between the signals obtained.

However, the two measurement chains used in these two apparatuses will not generally be perfectly identical, so that on the one hand the difference signal obtained will in reality be due to structural differences of two apparatuses. On the other, as the calculated difference is small compared with the two separately measured quantities, said difference must be very accurately calculated in order to be significant.

SUMMARY OF THE INVENTION

The present invention aims at obviating these disadvantages. To this end, it proposes the combination of two directional resonance magnetometers (like those described hereinbefore), in such a way that the field difference which it is wished to measure directly appears at a point of the circuit, without it being necessary to extract two measurement signals and form the difference therefrom.

In order to carry this out, the differential magnetometer according to the invention comprises a first reference assembly and at least one measurement assembly, said two assemblies being combined so that the polarization current of the reference magnetometer is imposed on the measurement magnetometer, the latter then being out of resonance, and supplying as a result an error signal, which directly represents the difference in the fields to which the two magnetometers are exposed.

More specifically, the present invention relates to a differential magnetometer comprising:

A) a first reference assembly comprising:

a first sample with spins placed at a certain first point (A), first means for applying to said sample a magnetic polarization field (Hp), said first means being traversed by a certain current (Ip), first means for the excitation and detection of the resonance of the spins in the first sample and for supplying a first signal (Vr), which is zero when the field applied to the first sample at the value (Ho) corresponding to the resonance of the spins of the first sample placed at point A and positive or negative when the field applied differs from said value (Ho), first feedback means able to create a first feedback field reestablishing the value (Ho) of the field (H) corresponding to resonance;

B) at least one second measurement assembly comprising:

a second sample with spins placed at a certain second point (B) spaced from the first point (A), said second sample being similar to the first, second means for applying to said second sample a magnetic polarization field (Hp), said second means being identical to the first, are oriented parallel to the first and traversed by the same current (Ip), second means for exciting and detecting the resonance of spins in the second sample, said second means being at the same frequency as the first and also being able to supply a signal which is zero when the field applied to the second sample has the value (Ho) corresponding to the resonance of the spins of the second sample placed at point B and which is positive or negative when the field applied differs from the value (Ho), second feedback means able to create a second feedback field reestablishing the value $(Ho)_B$ of the field corresponding to the resonance of the spins in the second sample, an output connected to said second feedback means, said output supplying a signal corresponding to the feedback field and which is proportional to the difference of the fields present at the first and second points (A, B)

BRIEF DESCRIPTION OF THE DRAWINGS

FIG. 1 shows a variant of a prior art directional resonance magnetometer.

FIG. 2 shows the composition of the different fields present.

FIG. 3 illustrates a dispersion curve around the resonance.

DETAILED DESCRIPTION OF THE EMBODIMENTS

Figure 7:
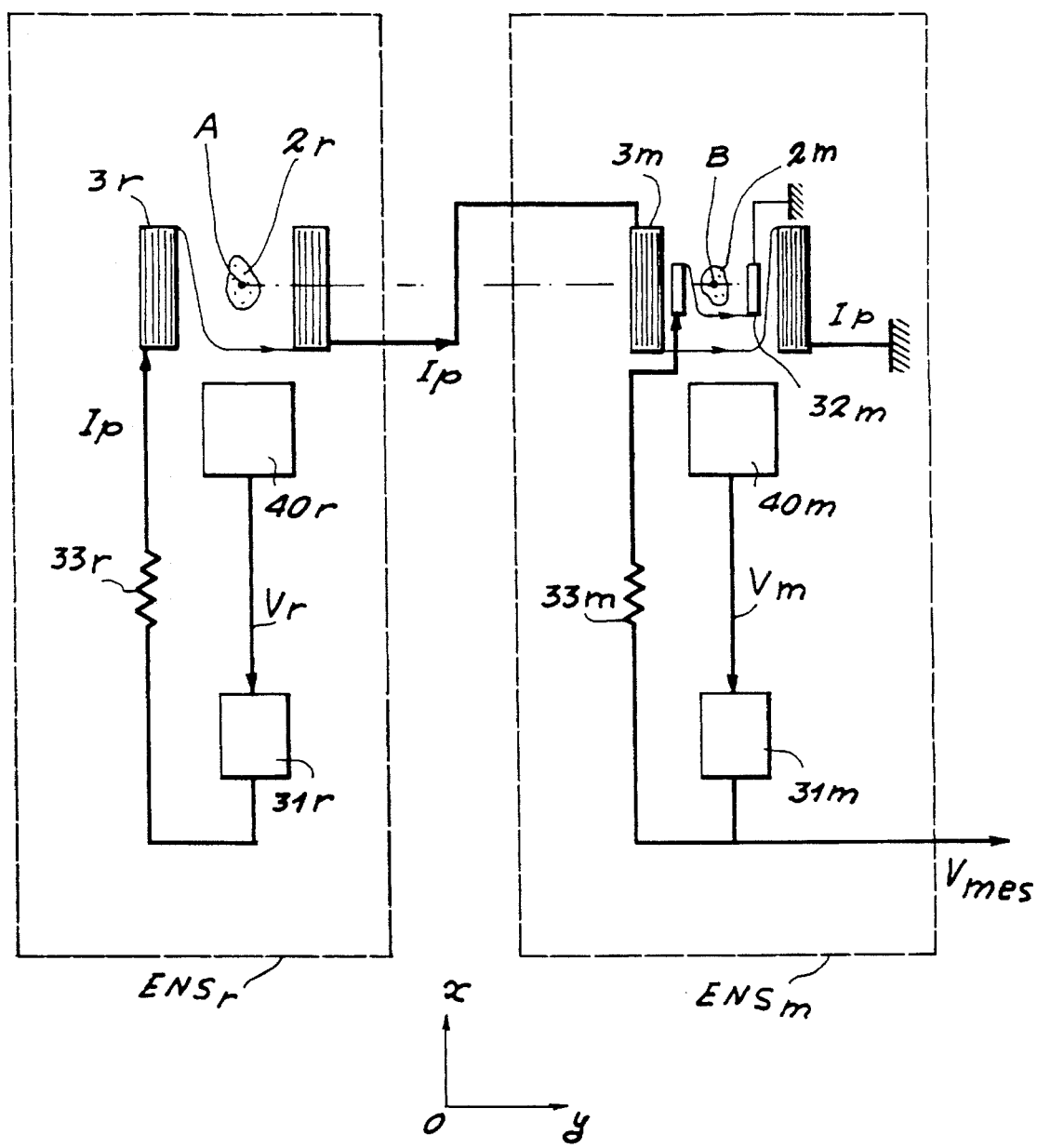
FIG. 7 is a general diagram of a differential magnetometer according to the invention.

FIG. 7 is a general diagram of a differential magnetometer according to the invention in the case where there is only one measurement assembly. The apparatus shown comprises a reference assembly ENSr and a measurement assembly ENSm. The two assemblies essentially incorporate the same means and are referenced in the same way, with an index r for the reference assembly and an index m for the measurement assembly. There are two identical samples 2r, 2m (with nuclear or electron spins) placed at two separate points A and B, two polarization windings 3r, 3m having parallel axes, the winding 3m also creating the feedback field and a feedback winding 32m.

Figure 4:
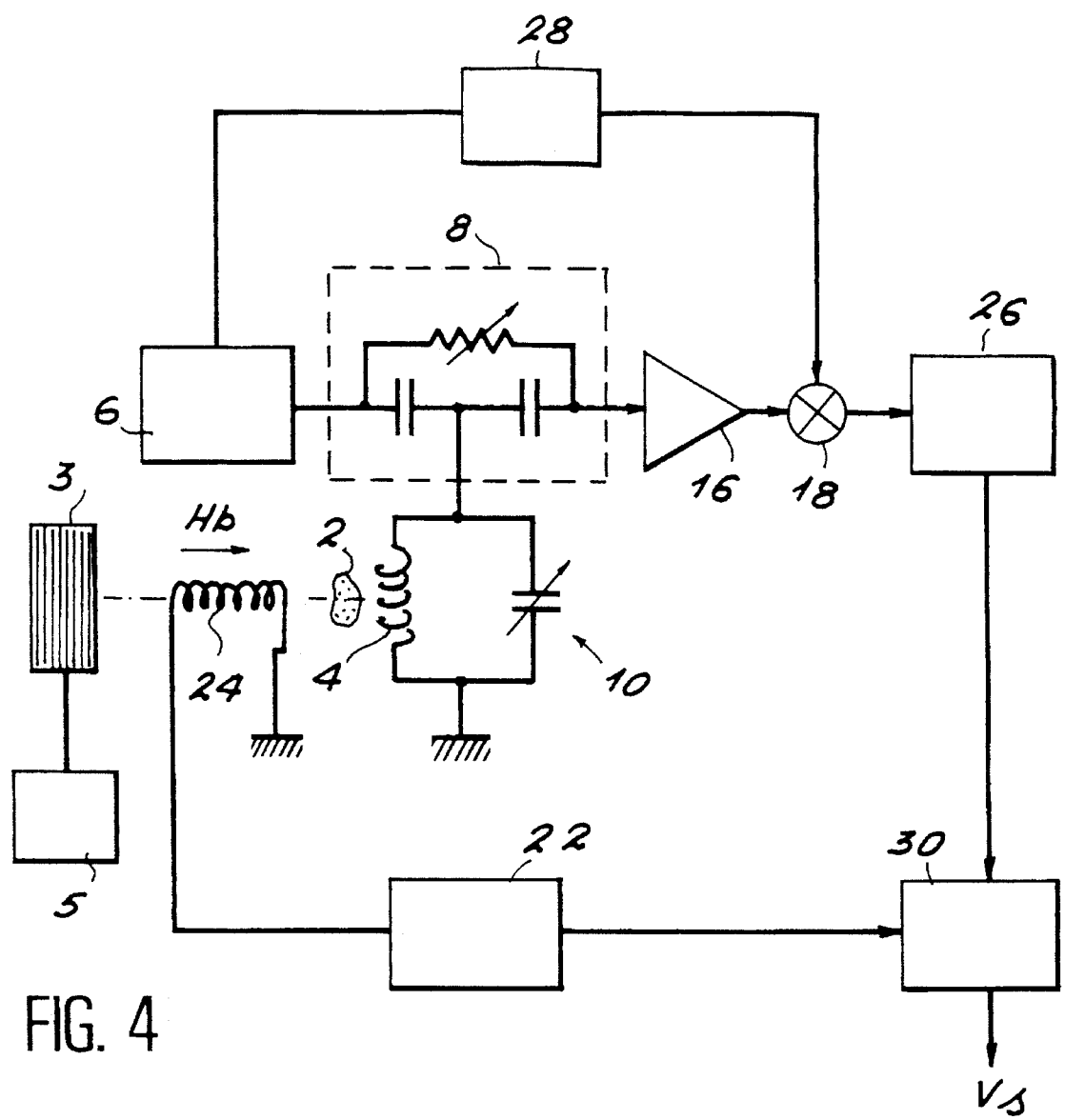
FIG. 4 shows another variant of a prior art magnetometer with a dither field.
Figure 6:
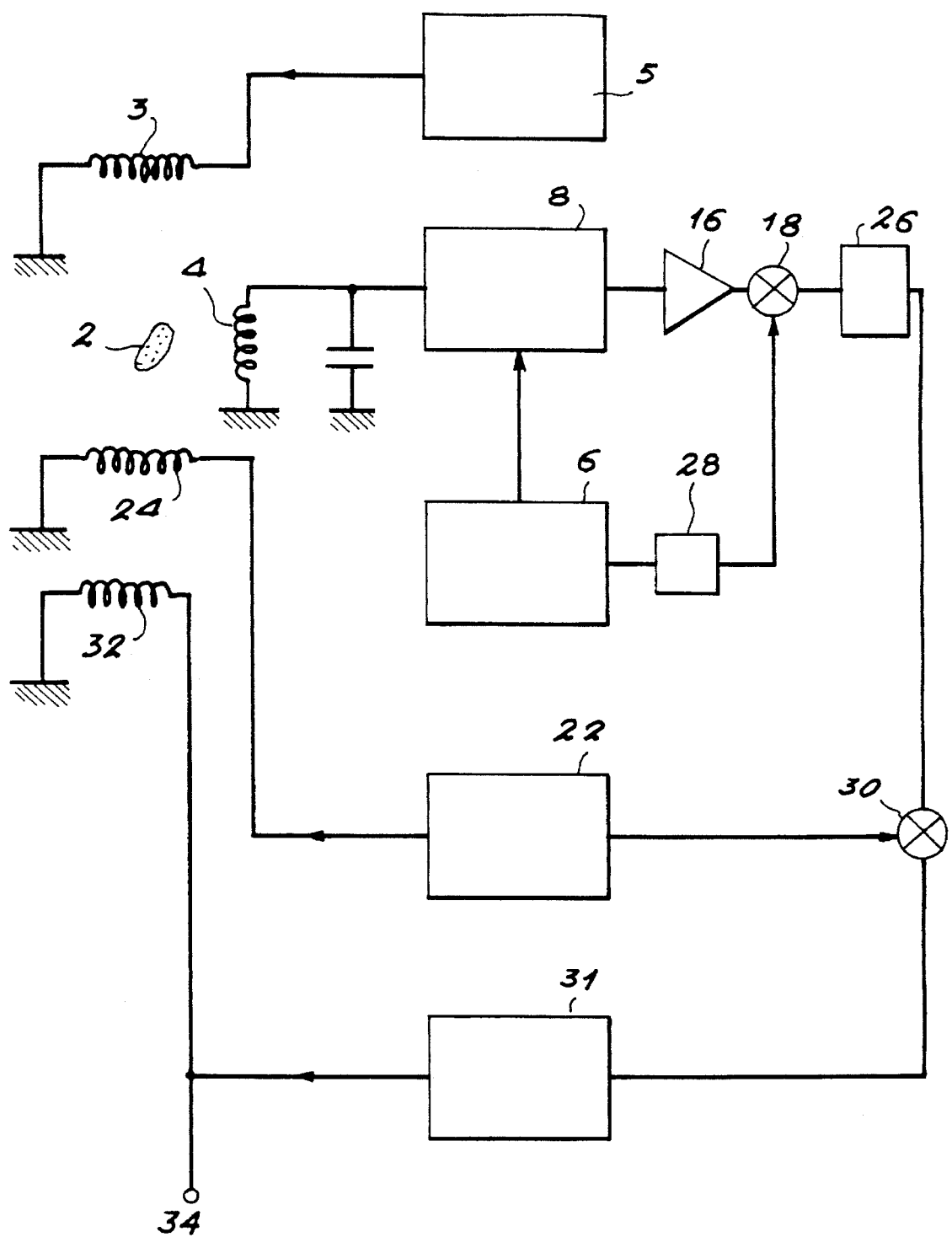
FIG. 6 shows another variant of a prior art magnetometer with a dither field and a feedback field.

In addition, each assembly has the means already used in the prior art and symbolized by the blocks 40r and 40m. These are means which have already been described relative to FIGS. 1, 4 and 6, considered singly or in combination (optionally including dither means) and which make it possible to excite the resonance, detect it and supply a signal (Vr, Vm) cancelling out when the total magnetic field assumes the value Ho corresponding to resonance.

The two assemblies also incorporate integrators 31r, 31m assumed to operate in voltage and voltage - current converters shown in the form of resistors 33r, 33m.

A current Ip flows in the winding 3r. As the latter winding is connected in series with the winding 3m, the same current flows through the latter winding. Instead of connecting the windings 3r, 3m in series, they could be arranged independently and supplied by two identical current sources of the same nominal value.

With regards to the operation of the circuits 40r and 40m at the same reference, this can take place by interconnecting the different means (master/slave operation), or by connecting these means to such as a clock or by presetting these means to the same frequency.

The differential magnetometer of FIG. 7 functions as follows. If the field to be measured is the same at points A and B, the first assembly ENSr supplies to the second ENSm a polarization current Ip, which is precisely the current which ensures resonance in the assembly ENSm. The voltage Vmes measured at the output of 31m is consequently zero, which represents the zero nature of the difference of the fields at A and B.

However, if the field at B is different from that at A, the current Ip produced by the reference assembly ENSr will no longer correspond to the resonance in the measurement assembly ENSm. Therefore an error signal will be present at the output of the feedback circuit and the integrator 31m. The error signal Vines will represent the field difference between the points A and B.

These points can be made clear by referencing the field to be measured by its components and its variations along two axes Ox, Oy shown at the bottom of FIG. 7. The axis Oy is directed along the segment AB. The external magnetic field can be represented by a vector $\vec{Hex}$ at point A and $\vec{Hex}+\vec{Hy}$ at point B. At point A, the field in the axis defined by the coil 3r can be expressed by:

$$\vec{Ho}=\gamma \vec{fo}=\vec{H_p}+(1/H_p)(\vec{Hex}\bullet \vec{H_p}), \quad (1)$$

$H_p$ being the field due to the feedback current $I_p$:

$$H_p = K \frac{Vr}{R} = KIp \quad (2)$$

in which K is the transfer coefficient of the coil 3r (respectively 3m) connecting the magnetic field created in said coil by $I_p$ and R is the resistance of 33r (respectively 33m).

The expression (1) is a first order approximation applicable if Ho significantly exceeds Hex.

At point B, the field in the axis defined by the coil 3m can be expressed by:

$$\vec{H}=\vec{H_p}+(1/H_p)((\vec{Hex}+\vec{\Delta Hy})\bullet \vec{H_p}) \quad (3)$$

$$\vec{H}=\vec{H_p}+1/H_p(\vec{Hex}\bullet \vec{H_p})+(1/H_p)(\vec{\Delta Hy}\bullet \vec{H_p}) \quad (4)$$

By combining the relations (4) and (1), we obtain:

$$\vec{H}=Ho+(1/H_p)(\vec{\Delta Hy}\bullet \vec{H_p}) \quad (5)$$

$\Delta Hy$ representing the variation of Hex along axis AB.

If the distance d between A and B tends towards zero, the quantity $(1/H_p)Hy \bullet \vec{H_p}$ ends towards the partial derivative $$\frac{\delta Hex|^x}{\delta y},$$

$Hex|^x$ being the component of Hex along axis x. This derivative is a component of the gradient tensor of the magnetic field.

Figure 5:
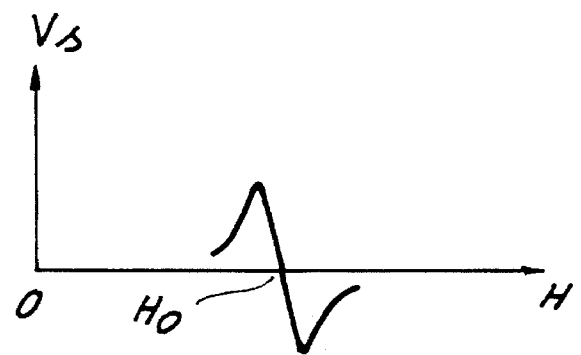
FIG. 5 illustrates the dispersion curve obtained with a magnetometer of the latter type.

If the projection of the field along x does not vary according to the axis y, the expression (5) becomes H=Ho and the voltage Vm is zero, because the system B is maintained at resonance. However, a variation along the axis y represents a voltage according to FIG. 5. This voltage can be used directly in its linear part as the output voltage of the differential magnetometer and is then proportional to the quantity $(1/H_p)(\Delta Hy \bullet H_p)$.

If not, the measurement assembly ENSm is maintained at resonance by the feedback signal supplied by the assembly 31m, 33m and we obtain $$H=Ho=Ho+(1/H_p)(\vec{\Delta Hy}\vec{H_p})+Hcr \quad (6)$$

Hcr being the feedback field created by the coil 32m. It should be noted that coil 32m can be combined with coil 3m on adding the currents Ip and Icr.

On the basis of (6), we obtain:

$$(1/H_p)(\vec{\Delta Hy}\bullet \vec{H_p})=-Hcr \quad (7)$$

The voltage Vmes is consequently proportional to the quantity to be measured.

Thus, a direct differential measurement has taken place without it being necessary to form the precise difference of two quantities given by two identical magnetometric measurement chains. It should be noted also that the problem of the stability of the dimensions of the coil 3r or 3m intervening on the factor K of the equation (2) and which is important in the case of a non-differential resonance magnetometer, does not occur, provided that the coils 3r and 3m are identical and subject to the same temperature, the quantity Hp being identical in A and B.

It is possible to simultaneously perform differential measurements at several points in space with respect to the same reference located at a point A. it is sufficient to position several assemblies such as ENSm at other points, with their polarization coils traversed by the same current as the reference assembly.

Figure 8:
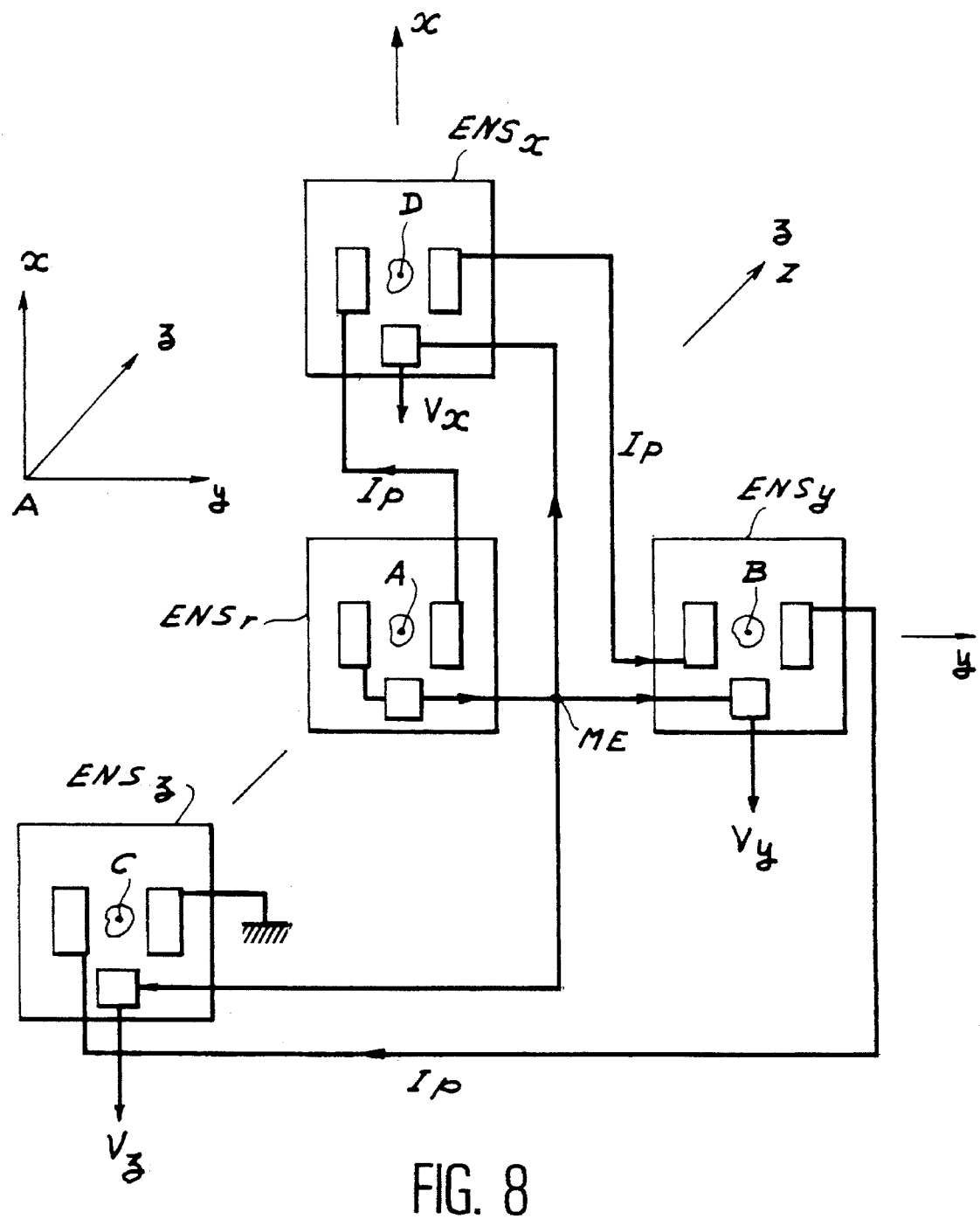
FIG. 8 illustrates an embodiment of a differential magnetometer according to the invention having three measurement assemblies arranged in a trihedral.

This is shown in FIG. 8, where it is possible to see a reference assembly ENSr positioned around a point A and three measurement assemblies respectively ENSx, ENSy, ENSz placed at three points B, C and D located on three axes forming a trihedral Ax, y, z. The three measurement assemblies receive the same polarization current Ip e.g. formed in the reference assembly and supply three signals Vx, Vy, Vz, which represent the variations of the field along the three axes Ax, Ay, Az.

In FIG. 8, the means for exciting and detecting the different assemblies are at the same frequency as a result of a master/slave operation. In this representation, the master corresponds to the assembly ENSr and the slaves to the assemblies ENSx, ENSy, ENSz.

I claim:

1. A differential resonance magnetometer, comprising: a first assembly comprising:

a first sample with spins placed at a first point;

first means for applying to said first sample a first magnetic polarization field, said first means being traversed by a predetermined current;

first means for exciting and detecting the resonance of the spins in the first sample at a predetermined frequency and for outputting a first signal, the first signal being zero when the field applied to the first sample has a first predetermined value corresponding to the resonance and which is positive or negative when the field applied differs from the first predetermined value; and a first feedback means generating a first feedback field reestablishing the first predetermined value of the field corresponding to the resonance; a second assembly comprising:

a second sample with spins placed at a second point spaced from the first point;

second means for applying to said second sample a second magnetic polarization field, said second means being identical to the first means, and being traversed by the predetermined current;

second means for exciting and detecting the resonance of the spins in the second sample at the predetermined frequency and for outputting a second signal, the second signal being zero when the field applied to the second sample has a second predetermined value corresponding to the resonance of the spins of the second sample and being positive or negative when the field applied differs from the second predetermined value;

second feedback means generating a second feedback field reestablishing the second predetermined value of the field corresponding to the resonance in the second sample;

an output connected to the second feedback means, said output supplying an output signal proportional to a difference of the fields present at the first and second points.

2. The magnetometer according to claim 1, wherein the first means for applying the first polarization field to the first sample of the first assembly is connected in series with the second means for applying the second polarization field to the second sample of the second assembly.

3. The magnetometer according to claim 1, wherein the first means for applying the first polarization field to the first sample of the first assembly and the second means for applying the second polarization field to the second sample of the second assembly are supplied by two identical current sources with the same nominal value.

4. The magnetometer according to claim 1, wherein the first and second means for exciting and detecting the resonance of the first assembly and the second assembly impose the same excitation and detection frequency.

5. The magnetometer according to claim 1, wherein the second feedback means comprises a feedback winding to generate the second feedback field.

6. The magnetometer according to claim 1, further comprising:

a third assembly identical to the second assembly placed around a third point spaced from the first and second points.

7. The magnetometer according to claim 6, further comprising:

a fourth assembly identical to the second assembly placed around a fourth point spaced from the first, the second and the third points.

8. The magnetometer according to claim 7, wherein the four points form a trihedral around which are located the first, second, third and fourth assemblies.

9. The magnetometer according to claim 7, wherein each of the assemblies of the magnetometer also comprise exciting means able to create a dither field of the same direction as the polarization field created in each of said respective assemblies.

10. The magnetometer according to claim 7, wherein the first and second exciting and detection means are preset to the same frequency.

* * * * *